United States Patent
Taguchi et al.

(10) Patent No.: US 7,719,183 B2
(45) Date of Patent: May 18, 2010

(54) MANUFACTURING METHOD OF ORGANIC ELECTROLUMINESCENT DEVICE AND AN ORGANIC ELECTROLUMINESCENT DEVICE

(75) Inventors: Takao Taguchi, Tokyo (JP); Eiichi Kitazume, Tokyo (JP); Akiko Uchibori, Tokyo (JP)

(73) Assignee: Toppan Printing Co., Ltd. (JP)

( * ) Notice: Subject to any disclaimer, the term of this patent is extended or adjusted under 35 U.S.C. 154(b) by 337 days.

(21) Appl. No.: 11/454,498

(22) Filed: Jun. 16, 2006

(65) Prior Publication Data

US 2007/0001589 A1 Jan. 4, 2007

(30) Foreign Application Priority Data

Jul. 1, 2005 (JP) ............... 2005-193537

(51) Int. Cl.
*H01L 51/54* (2006.01)
*H01L 51/56* (2006.01)

(52) U.S. Cl. ............... 313/506; 313/503; 313/504; 313/505

(58) Field of Classification Search ............ 445/24–25; 313/495–512; 315/169.3, 169.4; 257/40, 257/79; 428/690

See application file for complete search history.

(56) References Cited

U.S. PATENT DOCUMENTS

| | | | |
|---|---|---|---|
| 5,726,724 A * | 3/1998 | Shirota et al. ............... | 349/106 |
| 6,420,200 B1 | 7/2002 | Yamazaki et al. | |
| 6,582,504 B1 | 6/2003 | Fujita | |
| 6,954,031 B2 * | 10/2005 | Hashimoto et al. ........... | 313/503 |
| 2002/0001026 A1 * | 1/2002 | Ishikawa et al. ............ | 347/101 |
| 2004/0021413 A1 | 2/2004 | Ito et al. | |
| 2005/0070037 A1 | 3/2005 | Roberson et al. | |
| 2005/0089629 A1 * | 4/2005 | Nishimura et al. ............ | 427/66 |

FOREIGN PATENT DOCUMENTS

| | | |
|---|---|---|
| EP | 0 954 205 | 11/1999 |
| JP | 05-078655 | 3/1993 |
| JP | 10-012377 | 1/1998 |
| JP | 10-077467 | 3/1998 |
| JP | 11-024604 | 1/1999 |
| JP | 11-273859 | 10/1999 |
| JP | 2001-076873 | 3/2001 |
| JP | 2001-093668 | 4/2001 |
| JP | 2001-155858 | 6/2001 |
| JP | 2001-155861 | 6/2001 |
| JP | 2001-185360 | 7/2001 |
| JP | 2001-291587 | 10/2001 |
| JP | 2002-100472 | 4/2002 |

(Continued)

*Primary Examiner*—Bumsuk Won
*Assistant Examiner*—Elmito Breval
(74) *Attorney, Agent, or Firm*—Squire, Sanders & Dempsey L.L.P.

(57) ABSTRACT

One embodiment of the present invention is a manufacturing method of an organic electroluminescent device, the method including: forming a first electrode on a substrate; forming an organic luminescence media layer over the first electrode which emits light by applying a voltage wherein the organic luminescence media layer includes a hole transport layer and an organic luminous layer; and forming a second electrode on the organic luminescence media layer, wherein the method further includes: forming the hole transport layer by applying a polymeric hole transport material, and further forming the organic luminous layer on the hole transport layer by applying an ink including 0.3% by weight 3% by weight of a low molecular organic luminous material having a molecular weight less than or equal to 5000 Daltons.

8 Claims, 8 Drawing Sheets

FOREIGN PATENT DOCUMENTS

| | | |
|---|---|---|
| JP | 2002-305077 | 10/2002 |
| JP | 2002-313561 | 10/2002 |
| JP | 2003-017248 | 1/2003 |
| JP | 2003-059654 | 2/2003 |
| JP | 2003-059656 | 2/2003 |
| JP | 2003-217853 | 7/2003 |
| JP | 2003-243163 | 8/2003 |
| JP | 2003-264076 | 9/2003 |
| JP | 2003-282244 | 10/2003 |
| JP | 2004-055333 | 2/2004 |
| JP | 2004-063359 | 2/2004 |
| JP | 2004-071432 | 3/2004 |
| JP | 2004-087245 | 3/2004 |
| JP | 2004-152746 | 5/2004 |
| JP | 2004-355913 | 12/2004 |
| WO | WO 99/10862 | 4/1999 |

* cited by examiner

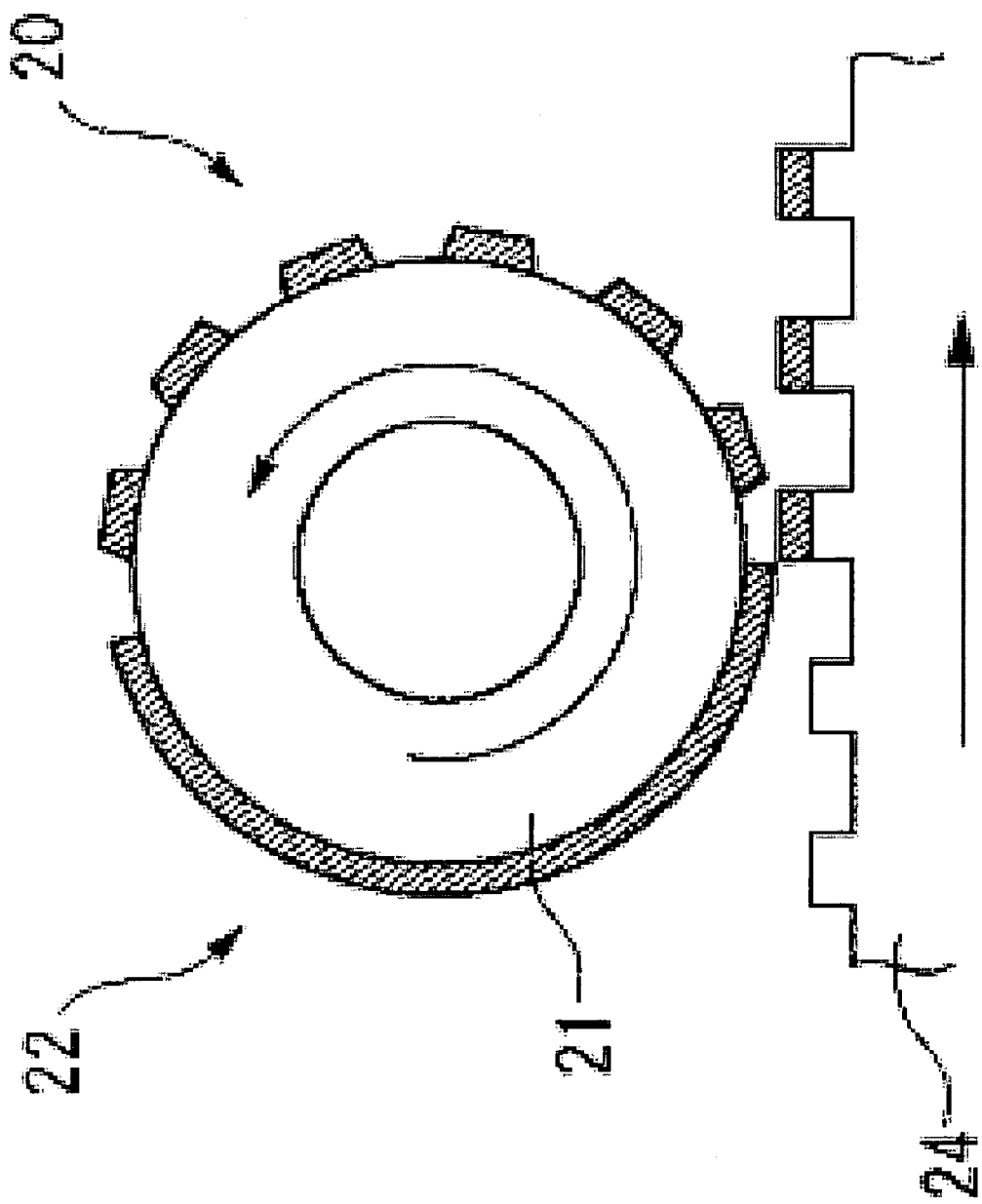

MANUFACTURING METHOD OF ORGANIC ELECTROLUMINESCENT DEVICE AND AN ORGANIC ELECTROLUMINESCENT DEVICE

CROSS REFERENCE

This application claims priority to Japanese application number 2005-193537, filed on Jul. 1, 2005, which is incorporated by reference.

BACKGROUND OF THE INVENTION

1. Field of the Invention

The present invention is related to a manufacturing method of an organic electroluminescent device using electroluminescent phenomena of organic thin film and an organic electroluminescent device.

2. Description of the Related Art

Organic electroluminescent device is explained below.

Organic electroluminescent device includes organic a luminous layer of electroconductivity and a transparent electrode layer and a counter electrode layer which are placed on either side of this organic luminous layer. As for the organic electroluminescent device, transparent electrode layer, organic luminous layer and counter electrode layer are laminated on a substrate of translucency by this sequence.

And, by means of applying voltage to organic luminous layer, electron and hole are poured into organic luminous layer. Then electron and hole couple again. Organic luminous layer emits light in this coupling.

A hole transport layer may be provided between the transparent electrode layer and the organic luminous layer which are anode to improve luminous efficiency of organic luminous layer. The electron transport layer may be provided between the counter electrode layer that is cathode and the organic luminous layer.

Generally, as for the organic luminous layer, the hole transport layer and the electron transport layer, molecular weight is high. Therefore, these layers are formed by functional material comprising polymeric materials which are easy to be dissolved in solvent. Thus, wet coating method such as spin coat method in air pressure and printing methods such as relief printing, inversion offset printing (for example, Japanese Patent Laid-Open No. 2003-17248 Official Gazette) or ink jet printing method (for example, The 3,541,625th Patent Official Gazette) are used, and each layer can be formed. Therefore, reduction of a cost of production facility and improvement of productivity can be planned.

However, in the above described manufacturing method of conventional organic electroluminescent device, there is the following problem:

When there is unevenness in the surface of transparent electrode layer, this unevenness cannot be coated uniformly. This problem is based on grounds of the following:

Organic luminous layer, hole transport layer and electron transport layer are formed respectively by using solution of functional material comprising polymeric materials. As density of this solution rises, viscosity of solution rises. Solution is printed on the surface of object by a printing method. However, till this solution dries, unevenness in the surface of object cannot be coated. Thus, because a high electric field is applied to the point where film thickness of organic luminous layer is thin locally, the point is subjected to big load. Therefore extra, flattening the surface of electrode layer is necessary. By way of example only, after having formed transparent electrode layer on a substrate, surface of the transparent electrode layer is polished.

The present invention was made in view of the above-mentioned problem. The present invention is aimed at providing a manufacturing method of organic electroluminescent device and the organic electroluminescent device that this unevenness is covered by the organic luminescence media layer without being affected by unevenness in the surface of the transparent electrode layer.

SUMMARY OF THE INVENTION

The present invention provides a manufacturing method of organic electroluminescent device and the organic electroluminescent device that unevenness in the surface of the transparent electrode layer is covered by organic luminescence media layer without being affected by the unevenness.

In a manufacturing method of the organic electroluminescent device which emits light by applying voltage to organic luminous layer between transparent electrode layer and a counter electrode layer, organic luminous layer is formed by using ink containing low molecular organic luminescent material of which molecular weight is less than or equal to 5000.

BRIEF DESCRIPTION OF DRAWINGS

FIGS. 4A, 4B and 4C are schematic illustrations which show inversion offset printer in the second embodiment of the present invention.

DESCRIPTION OF THE PREFERRED EMBODIMENT

Figure 1:
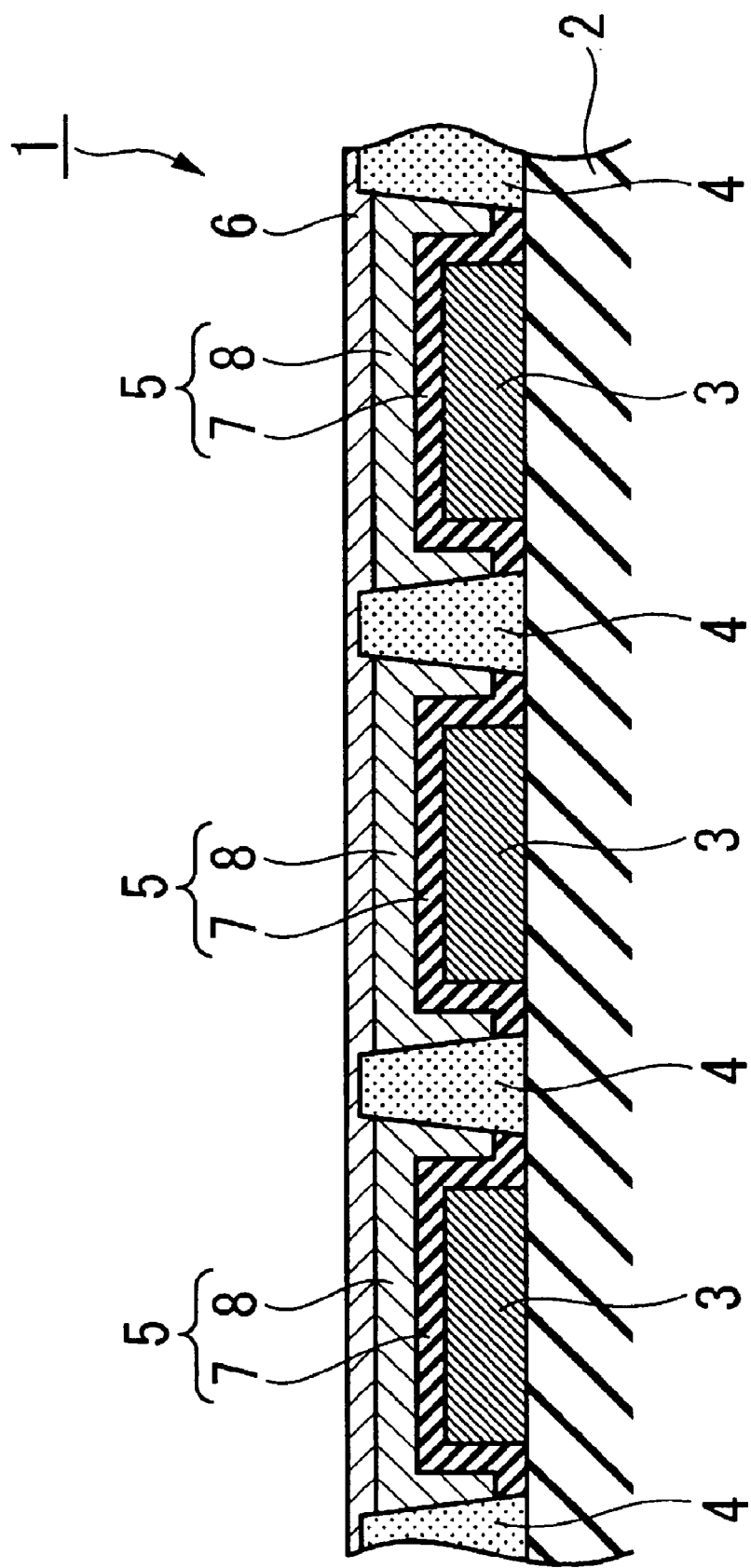
FIG. 1 is a cross figure which shows organic electroluminescent device in the first embodiment of the present invention.

The first embodiment of organic electroluminescent device of the present invention is explained referring to FIG. 1 as follows:

Organic electroluminescent device 1 of the present embodiment is organic electroluminescent device of so-called passive matrix configuration. This organic electroluminescent device consists of the following constituent: translucency substrate (a substrate) 2, plural transparent electrode layers (the first electrode layer) 3 on one surface of translucency substrate 2, partition wall 4 formed between each transparent electrode layer 3, organic luminescence media layer 5 which is laminated on transparent electrode layer 3 and counter electrode layer (the second electrode layer) 6 that is laminated on organic luminescence media layer 5. Counter electrode layer (the second electrode layer) 6 faces transparent electrode layer 3.

Translucency substrate 2 is a substrate supporting transparent electrode layer 3, organic luminescence media layer 5 and counter electrode layer 6. Translucency substrate 2 comprises a glass substrate, or a film or sheet made of plastic. For the film made of plastic, polyethylene terephthalate, polypropylene, cyclo olefin polymers, polyamide, polyether sulfone, polymethyl methacrylate and polycarbonate can be used.

In addition, on the other surface that transparent electrode layer 3 of translucency substrate 2 is not formed, ceramic evaporation film or gas barrier properties film such as polyvinylidene chloride, polyvinyl chloride and ethylene-vinyl acetate copolymer saponification material may be laminated.

Transparent electrode layer 3 is formed in the shape of a long strip of paper on translucency substrate 2. Pitch of long strip of paper-shaped transparent electrode layer 3 is constant. Film thickness of transparent electrode layer 3 is 0.05 μm-0.2 μm. In addition, transparent electrode layer 3 is made of conductive material having translucency in visible light area. ITO (IndiumTinOxide) can be used as this conductive material. A formation method of this transparent electrode layer 3 is explained below. Conductive material is layered by means of evaporation or sputtering method on one side of translucency substrate 2. Next transparent electrode layer 3 is formed by etching with the use of a mask having predetermined apertures configuration. In addition, for transparent electrode layer 3, metal complex oxide such as IZO (IndiumZincOxide), zinc complex oxide, zinc aluminium complex oxide and tin oxide ($SnO_2$), zinc oxide (ZnO), indium oxide ($In_2O_3$) can be used other than ITO. In addition, transparent electrode layer 3 may be formed by "coating and thermal decomposition method".

Example of "coating and thermal decomposition method" is described below. Precursor such as octylic acid indium or acetone indium is applied on translucency substrate 2. An oxide is formed by thermal decomposition afterwards. Transparent electrode layer 3 can be formed in this way.

In addition, in the case of organic electroluminescent device of so-called top emission type, translucency is not always required to the substrate and the first electrode layer.

Partition wall 4 is formed between each transparent electrode layer 3 on translucency substrate 2. For example, height of partition wall 4 is 2 μm. Partition wall 4 is installed to prevent organic luminescence media layer 5 in each transparent electrode layer 3 from mixing with each other. In addition, partition wall 4 is away from a penumbra of transparent electrode layer 3. And this partition wall 4 comprises a photosensitive resin of a positive type or negative type. A photosensitive resin is applied on translucency substrate 2 by application methods such as spin coater, bar coater, roll coater, die coater or gravure coating machine. Afterwards, partition wall is formed by patterning of a photosensitive resin by photolithography technics. For the photosensitive resin which can be applied for partition wall 4, polyimide system, acryl resin system or novolak resin system are exemplified.

For example, organic luminescence media layer 5 is a layer stack of two functional layers. By way of example only, two functional layers with hole transport layer 7 on a top face of transparent electrode layer 3 and organic luminous layer 8 on a top face of hole transport layer 7 can be exemplified. For example, film thickness of hole transport layer 7 is 0.05 μm. Hole transport layer 7 pushes forward a hole poured by anode to direction of cathode. An anode is transparent electrode layer 3. A cathode is counter electrode layer 6. On the other hand, hole transport layer 7 prevents electron from going to direction of transparent electrode layer 3.

A formation method of hole transport layer 7 is explained below. Solution or fluid dispersion of hole transport material for hole transport layer 7 is made. This application liquid or fluid dispersion is applied on transparent electrode layer 3 by wet coating method such as spin coat, bar coat, wire coat or slit coat. In addition, film thickness should be 0.01 μm-0.2 μm. It is preferable to be 0.02 μm-0.15 μm.

The hole transport material which can be applied for hole transport layer 7 is described below.

A high polymeric material such as poly aniline derivative, poly thiophenes, polyvinyl carbazoles, PEDOT (poly(3,4-ethylenedioxy thiophene)) and mixture with PEDOT and polystyrene sulfonate (PEDOT/PSS) can be used. In addition, toluene, dimethylbenzene, acetone, methyl ethyl ketone, methyl isobutyl ketone, cyclohexanone, methanol, ethanol, isopropyl alcohol, ethyl acetate, butyl acetate, water or these liquid mixture can be used as solvent for dissolution of hole transport material. In addition, detergent, antioxidant, viscosity modifier or UV absorber may be added in solution or fluid dispersion of the hole transport material if necessary. For example, polystyrene or polyvinylcarbazole can be used as viscosity modifier.

For example, as for organic luminous layer 8, film thickness from surface of transparent electrode layer 3 is 0.05 μm. Organic luminous layer 8 is formed by applying solution or fluid dispersion of the low molecular organic luminescent material that a luminescent color in application of a voltage is red, green or blue on hole transport layer 7. Molecular weight of this low molecular organic luminescent material is less than 5000.

In addition, a formation method of organic luminous layer 8 is described below. The organic luminescence ink which is solution or fluid dispersion is applied on hole transport layer 7 by relief printing, offset printing, ink jet process or inversion offset printing. Organic luminescence ink is dried afterwards. Film thickness should be 0.01 μm-0.1 μm. It is preferable to be 0.03 μm-0.1 μm.

Low molecular organic luminescent material used for organic luminous layer 8 of red luminescence is described below.

DCM (4-dicyanomethylene-6-(p-dimethylamino styryl)-2-carbinyl-4H-pyran) or DCJTB (4-dicyanomethylene-6-(p-dimethylamino styryl)-2-(t-butyl)-4H-pyran) which is dope materials of pyran system chemical compound are added in tris(8-quinolinol) Aluminium (Alq3) respectively. They are added respectively so that doping density is 2%. And, by means of dissolving this low molecular organic luminescent material in liquid mixture of toluene of 90% by weight and CHB (cyclohexylbenzene) of 10% by weight, solution is made. In addition, for example, density of low molecular organic luminescent material in solution is 1.5% by weight. In addition, density of low molecular organic luminescent material should be 0.1% by weight-10% by weight.

It is preferable to be 0.3% by weight-3% by weight. When density is 0.1% by weight-10% by weight, film thickness in printing does not become too large, and pattern accuracy in printing can be maintained.

As low molecular organic luminescent material used for organic luminous layer 8 of green emission, Alq3 is exemplified. By means of dissolving this low molecular organic luminescent material in liquid mixture of toluene of 90% by weight and CHB of 10% by weight, solution is made. For example, density of low molecular organic luminescent material in solution is 2% by weight. In addition, density of low molecular organic luminescent material should be 0.1% by weight-10% by weight. It is preferable to be 0.3% by weight-3% by weight.

Low molecular organic luminescent material used for organic luminous layer 8 of blue luminescence is described below. Dope materials are added in Alq3 so that doping density is 2%. For dope materials, the following material is exemplified. DPVBi (4,4'-bis(2,2'-diphenyl vinyl)-biphenyl) or Zn (BOX) 2(2-(O-hydroxyphenyl) Benzothiazole zinc complex) can be used. By means of dissolving this low molecular organic luminescent material in liquid mixture of toluene of 90% by weight and CHB of 10% by weight, solution is made. In addition, for example, density of low molecular organic luminescent material in solution is 2% by weight. In addition, density should be 0.1% by weight-10% by weight. It is preferable to be 0.3% by weight-3% by weight.

Counter electrode layer 6 is formed on organic luminous layer 8. A longer direction of counter electrode layer 6 is perpendicular to a longer direction of transparent electrode layer 3. Configuration of counter electrode layer 6 is a long strip of paper. Between counter electrode layers 6, there are constant spaces. Film thickness of counter electrode layer 6 is 0.01 μm-0.5 μm. Depending on luminescence property of luminous layer, the following material is selected for counter electrode layer 6: metal simple substance such as lithium, magnesium, calcium, ytterbium and aluminium; alloy of the above described metal simple substance and the metal which are stable such as gold, silver; and a multilayer body of the above described metal simple substance and the metal which are stable such as gold, silver. In addition, electroconductivity oxides such as indium, zinc and tin can be used. These materials is formed by vacuum deposition such as conventional resistance heating and EB heating or sputtering method.

A description is now made of a manufacturing method of organic electroluminescent device 1 such as the above.

At first transparent electrode layer 3 is formed on translucency substrate 2. ITO membrane is formed on a whole area of translucency substrate 2 by sputtering method. Even more particularly, exposure and developing by photolithography technics are performed. A part of transparent electrode layer 3 is coated by a photoresist. An unnecessary part of ITO membrane is removed by means of etching with acid solution. In this way, transparent electrode layer 3 of configuration of a long strip of paper is formed.

Partition wall 4 is formed between each transparent electrode layer 3 next.

A photoresist is applied on translucency substrate 2 or transparent electrode layer 3. Exposure and developing by photolithography technics are performed. A photoresist remains between each transparent electrode layer 3. By means of baking, a photoresist is stiffened afterwards.

And hole transport layer 7 is formed.

Hole transport layer 7 is formed by applying fluid dispersion of hole transport material on translucency substrate 2 or transparent electrode layer 3 by spin coat method.

Figure 2:
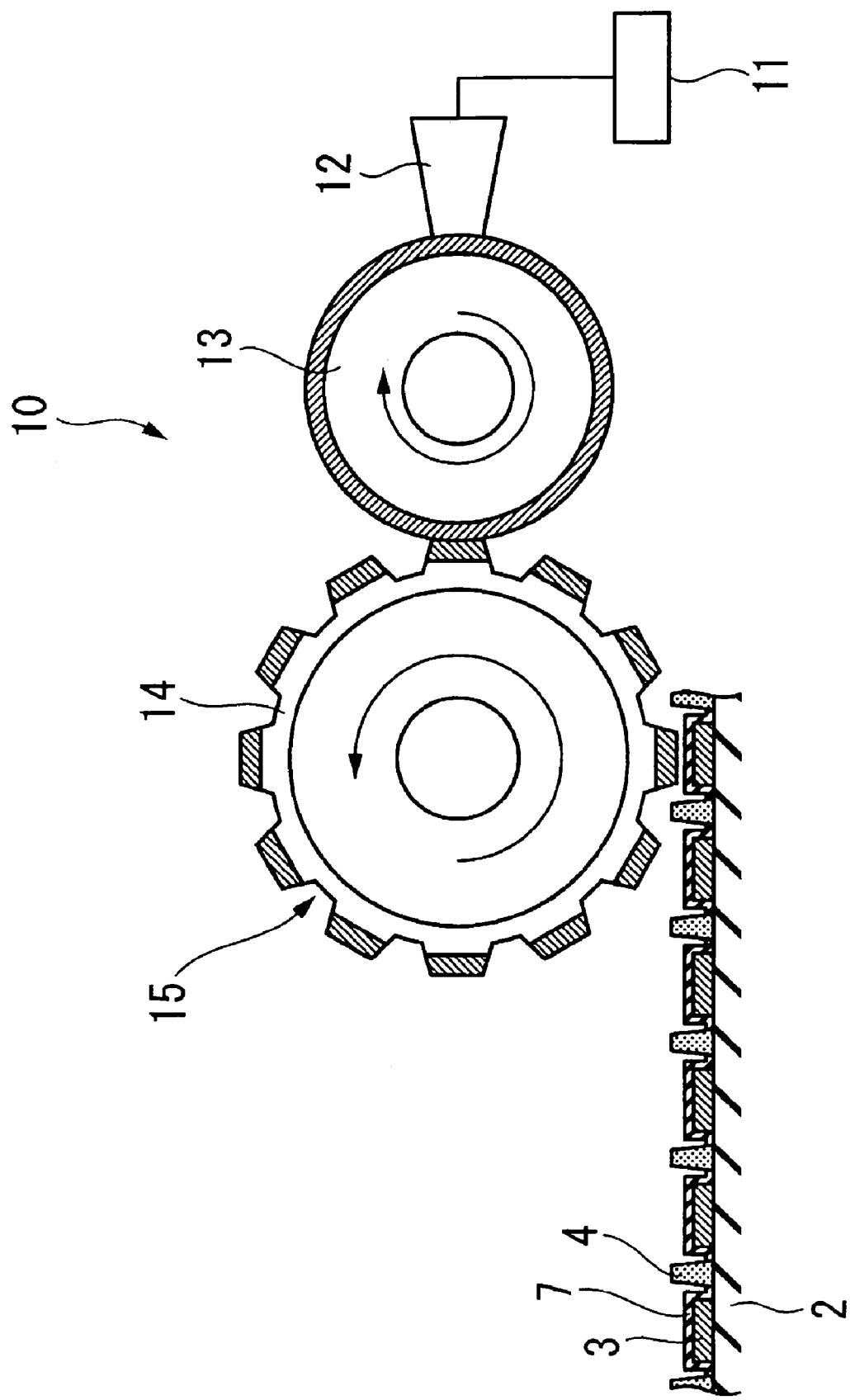
FIG. 2 is a schematic illustration which shows device of relief printing in the first embodiment of the present invention.

Organic luminous layer 8 is formed by printing of the organic luminescence ink which is solution of organic luminescent material with relief printing device 10 shown in FIG. 2 afterwards. This relief printing device 10 includes ink tank 11 which organic luminescence ink is accommodated, ink chamber 12 that ink is supplied, anilox roll 13 and plate cylinder 15 which relief printing plate 14 is installed.

Ink in ink tank 11 which organic luminescence ink of red is accommodated is supplied to ink chamber 12. And ink is applied in the surface of anilox roll 13. Ink applied to surface of anilox roll 13 is transferred to relief printing plate 14 next. This ink is transferred on hole transport layer 7.

Figure 3:
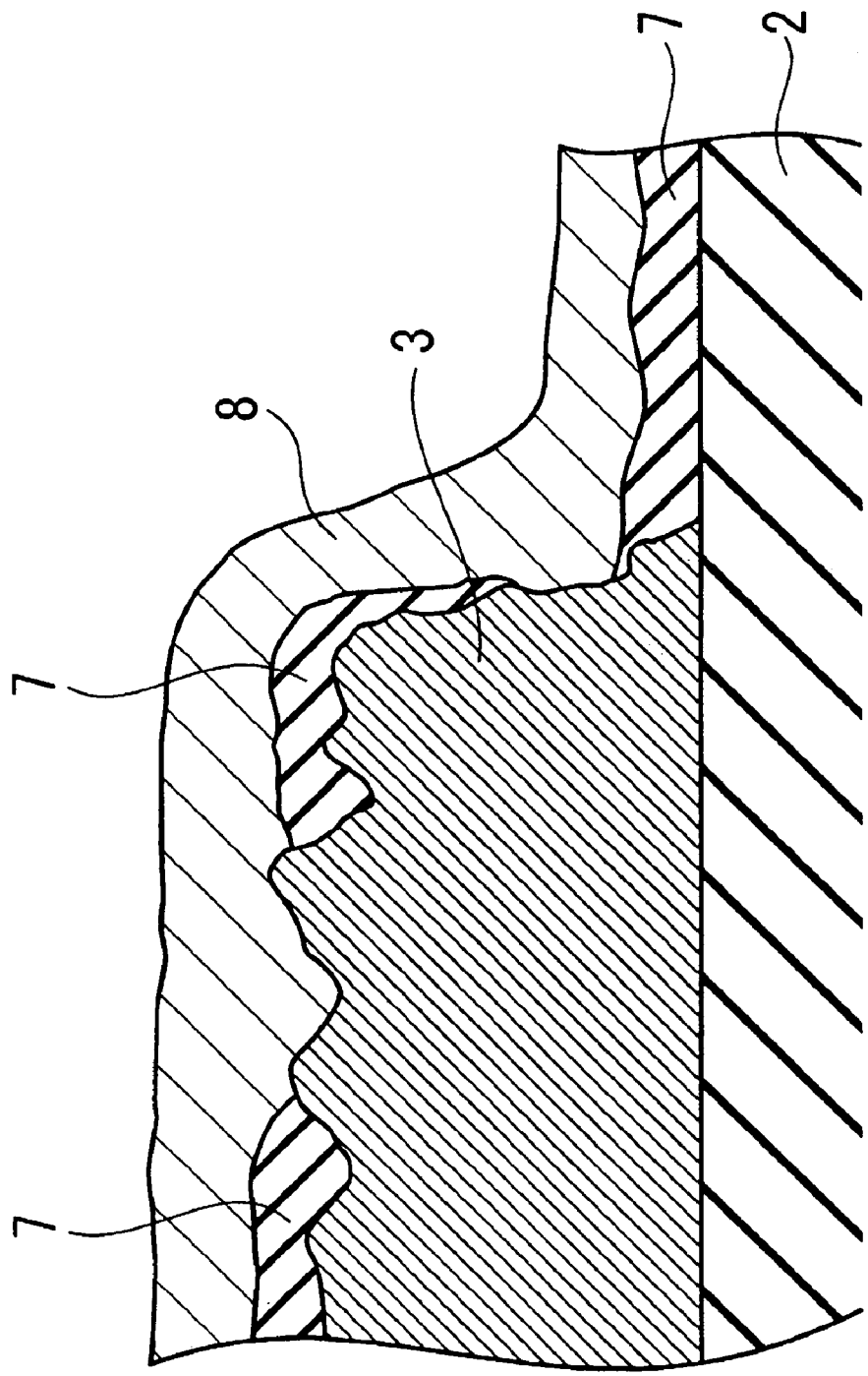
FIG. 3 is an expanded sectional view which shows vicinity of a fringe of transparent electrode layer of FIG. 1.

Because viscosity of ink is low, ink becomes flat in domain divided by partition wall 4. As shown in FIG. 3, surface of transparent electrode layer 3 or uneven surface between a fringe of transparent electrode layer 3 and translucency substrate 2 is partially coated by hole transport layer 7. However, these surfaces are coated by means of organic luminous layer 8 uniformly. Thus, transparent electrode layer 3 is not exposed out of organic luminous layer 8.

And ink is dried.

Same as organic luminescence ink of red luminescence, organic luminescence inks of green and blue are printed afterwards.

Counter electrode layer 6 is formed successively.

The mask that aperture of configuration of a long strip of paper is formed is placed on organic luminous layer 8. Evaporation by resistance heating evaporation method is performed. A mask is placed so that a longer direction of the aperture is perpendicular to a longer direction of transparent electrode layer 3.

In this way, counter electrode layer 6 is formed on organic luminous layer 8.

Configuration of counter electrode layer 6 is configuration of a long strip of paper which is perpendicular to a longer direction of transparent electrode layer 3. Counter electrode layer 6 is formed every constant space.

Transparent electrode layer 3, organic luminescence media layer 5 and counter electrode layer 6 are sealed by glass cap last to protect them from atmospheric oxygen and moisture.

Organic electroluminescent device 1 is produced in this way.

According to manufacturing method of organic electroluminescent device 1 and organic electroluminescent device 1 of the above, low molecular organic luminescent material is used as material of organic luminous layer 8. Therefore, when surface of transparent electrode layer 3 or uneven surface between a fringe of transparent electrode layer 3 and translucency substrate 2 is partially coated by hole transport layer 7, those surface can be coated by organic luminous layer 8 surely. Therefore, a high electric field is not applied to organic luminous layer 8 locally. There is not big load. Life time of organic electroluminescent device gets longer. And dielectric strength of organic luminous layer 8 rises. Luminance in luminescence rises. In addition, after the formation of transparent electrode layer 3, flattening of the surface of the layer 3 is unnecessary. It is not necessary to polish surface of transparent electrode layer 3. Therefore, simplification of manufacturing process and reduction of a cost can be planned. Even more particularly, organic luminescence media layer 5 is formed to cover transparent electrode layer 3. Therefore, aperture area of a pixel is large.

Figure 4A:
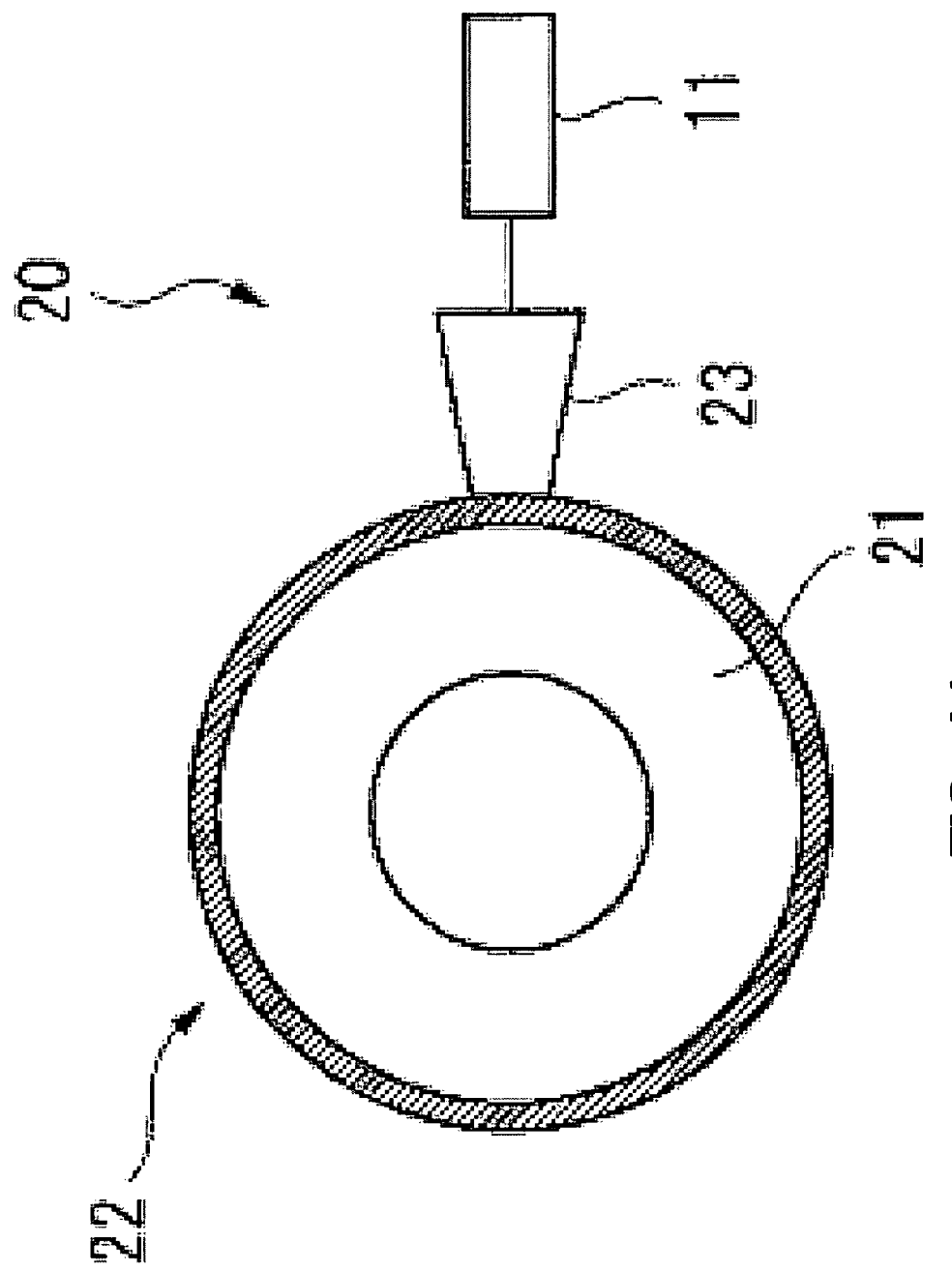
Figure 4C:
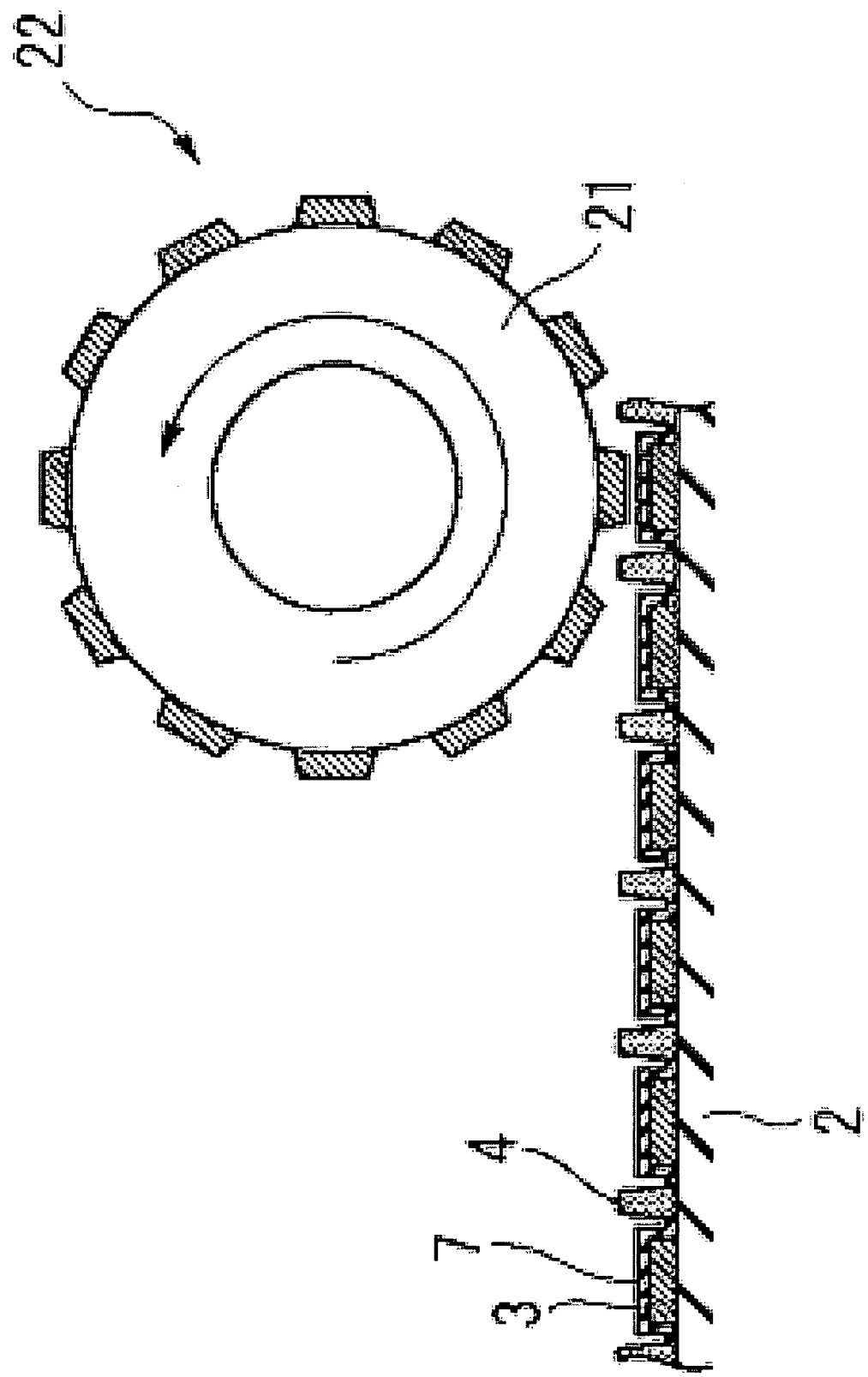

The second embodiment is explained in FIG. 4 next. In addition, in the following discussion, component explained in the above described embodiment is written down in same sign. In addition, explanation of it is omitted.

Different point between the second embodiment and the first embodiment is a formation method of organic luminous layer 8. In the present embodiment, organic luminous layer 8 is formed by inversion offset printing.

In other words, in a manufacturing method of organic electroluminescent device of the present embodiment, after having formed hole transport layer 7, inversion offset printer 20 as shown in FIG. 4 is used, and organic luminous layer 8 is printed. This inversion offset printer 20 includes ink tank 11 for the accommodation of organic luminescence ink, rotation chamber 22 with silicone rubber blanket 21, cap coating machine 23 which applies ink to blanket 21 and convex 24.

Ink is applied to blanket 21 by means of cap coater 23.(See FIG. 4(*a*)) Convex 24 touches blanket 21. Ink in an unnecessary part is transferred to convex 24. In other words, ink in an unnecessary part is removed from blanket.(See FIG. 4(*b*)). This removal occurs by the release characteristics that silicone rubber of blanket 21 has. In addition, configuration of a convex part of convex 24 is the pattern which is reverse to pattern of organic luminous layer 8. Ink contains organic luminescent material of low molecular material. Therefore, division characteristics of ink are preferable. Ink can be removed according to the determined pattern. Ink remaining in blanket 21 is transferred on hole transport layer 7 afterwards.(See FIG. 4(*c*)). Transferred ink becomes flat in domain divided by partition wall 4.

And organic luminescence inks of green emission and blue luminescence are transferred respectively.

Transferred ink are dried.

The above-mentioned organic electroluminescent device and the manufacturing method have a function, an effect same as the first embodiment, too.

Figure 5:
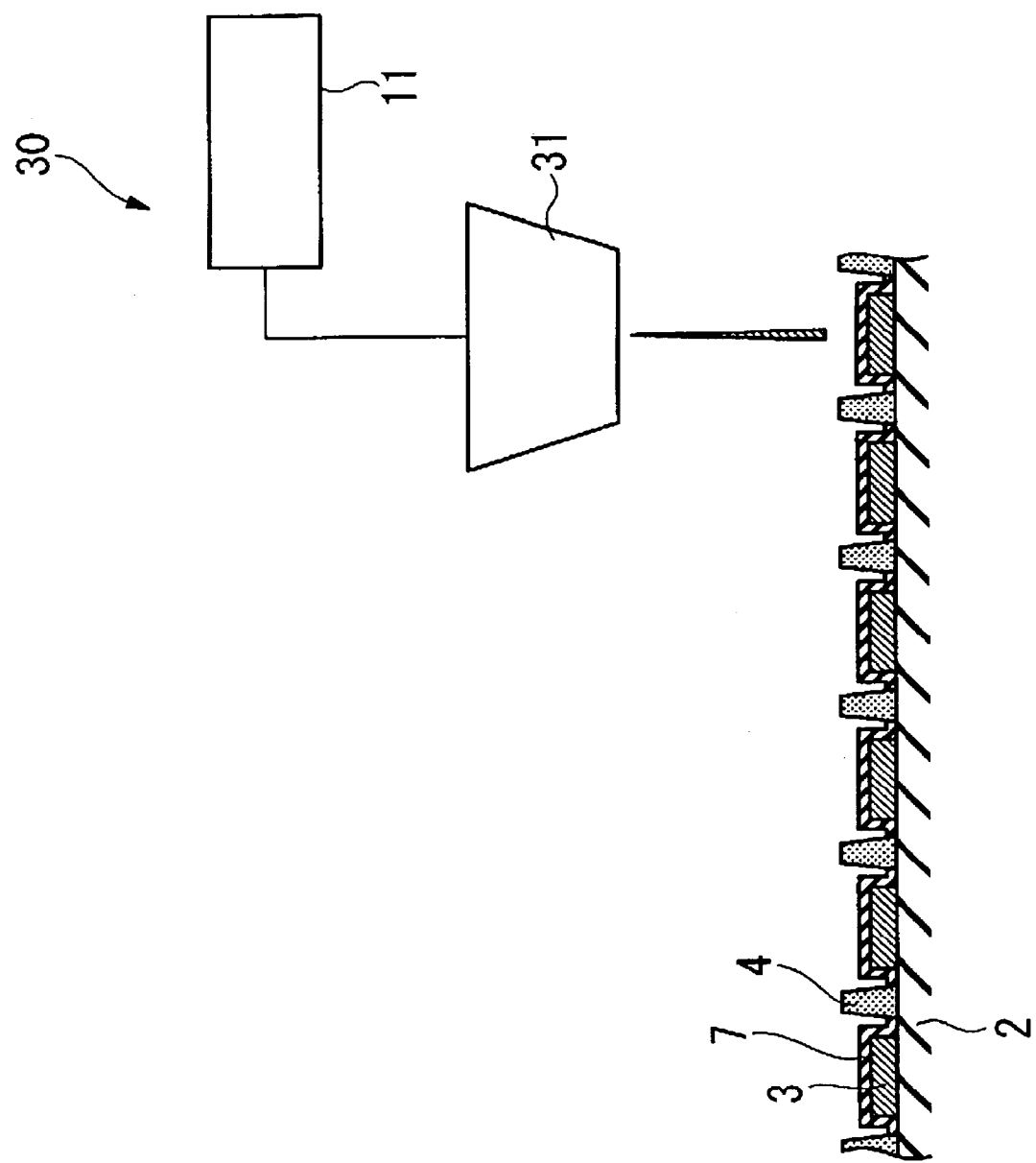
FIG. 5 is a schematic illustration which shows ink jet printer in the third embodiment of the present invention.

The third embodiment is explained in FIG. 5 next. In addition, in the following discussion, component explained in the above described embodiment is written down in same sign. In addition, the explanation of it is omitted.

Different point between the third embodiment and the first embodiment is a formation method of organic luminous layer 8. In the present embodiment, organic luminous layer 8 is formed by ink jet process.

In other words, in a manufacturing method of organic electroluminescent device of the present embodiment, after having formed hole transport layer 7, ink jet printer 30 as shown in FIG. 5 is used, and organic luminous layer 8 is printed. This ink jet printer 30 comprises ink tank 11 which organic luminescence ink is accommodated and ink jet head 31 jetting droplet of ink.

And droplet of ink is jetted to surface of hole transport layer 7 from ink jet head 31. Ink on hole transport layer 7 becomes flat due to low viscosity in domain divided by partition wall 4. Ink contains organic luminescent material of low molecular material. Therefore, an outlet of ink jet head 31 is not clogged up. And organic luminescence inks of green emission and blue luminescence are printed respectively.

Printed ink are dried.

The above-mentioned organic electroluminescent device and the manufacturing method have a function, an effect same as the first embodiment, too.

Figure 6:
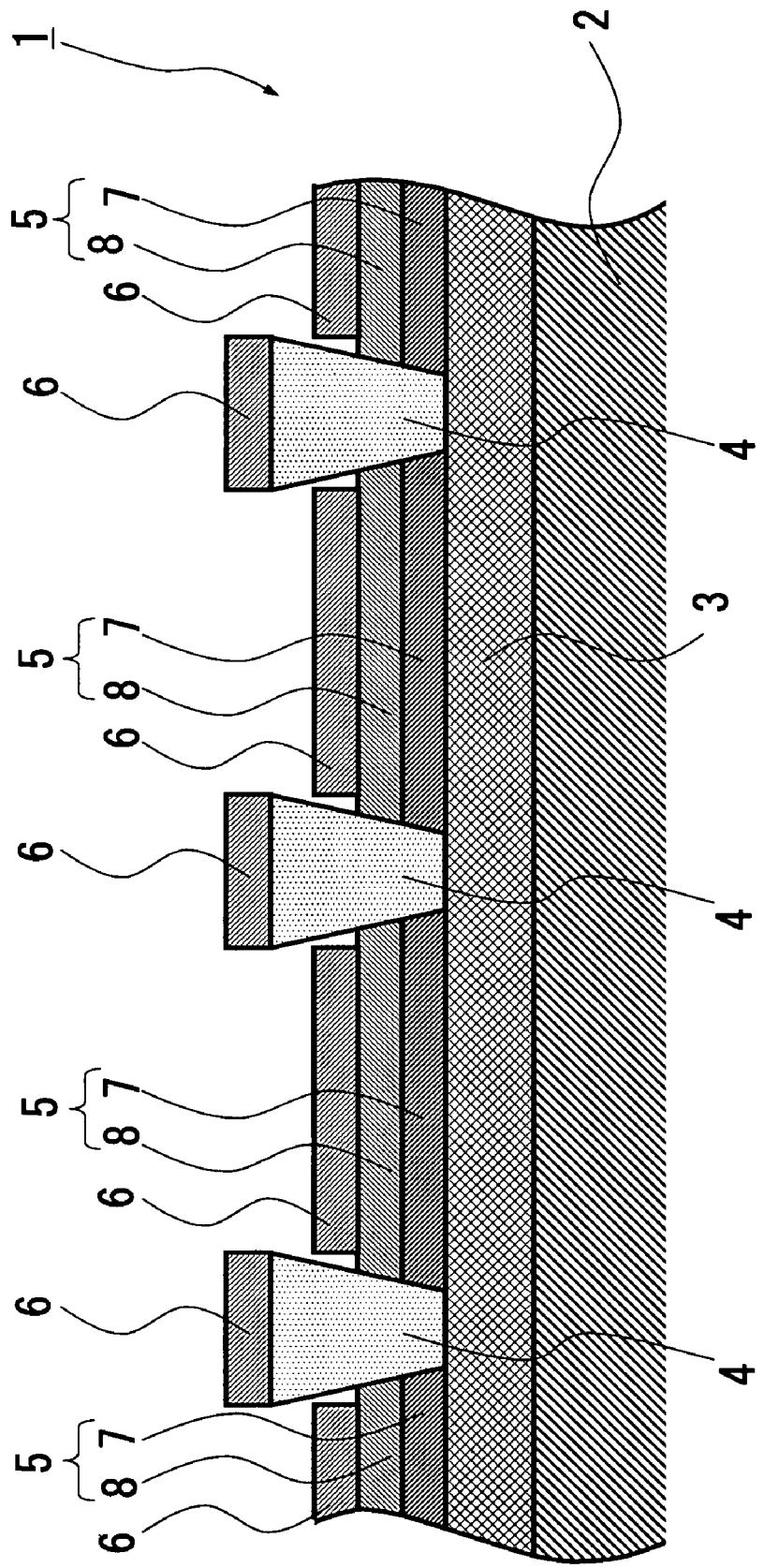
FIG. 6 is a cross figure which shows organic electroluminescent device in the fourth embodiment of the present invention.

The fourth embodiment of organic electroluminescent device of the present invention is explained in FIG. 6. In addition, in the following discussion, component explained in the above described embodiment is written down in same sign. In addition, the explanation of it is omitted.

Different point between the fourth embodiment and the first embodiment is direction of transparent electrode layer 3 and cross-sectional shape of partition wall 4.

In the first embodiment, partition wall 4 is away from a penumbra of transparent electrode layer 3. On the other hand, in the present embodiment, partition wall 4 is form of line which is perpendicular to transparent electrode layer 3.

Cross-sectional shape of partition wall 4 is inverted trapezoid. Partition wall of such a configuration can be formed by means of a photosensitive resin (a photoresist) of negative type. A photosensitive resin of negative type should be exposed through a stripe-shaped mask from upside. After having formed hole transport layer 7 between this partition wall 4, organic luminous layer 8 is formed by relief printing, inversion offset method or ink jet method.

Transparent electrode layer 3 of configuration of a long strip of paper is formed on translucency substrate 2. In addition, stripe-shaped partition wall 4 is formed to be perpendicular to transparent electrode layer 3 of configuration of a long strip of paper. Therefore, one part of transparent electrode layer 3 which is not covered by means of partition wall 4 is exposed. However, ink contains organic luminescent material of low molecular material. Viscosity of ink is low. Therefore, ink becomes flat in domain divided by partition wall 4.

In other words, the above-mentioned organic electroluminescent device and the manufacturing method have a function and an effect same as the first embodiment, too.

Counter electrode 6 is formed successively. Cross-sectional shape of partition wall 4 is inverted trapezoid. Therefore, even if counter electrode formation material is deposited without a mask from upside, counter electrode separates by side wall of partition wall. Counter electrode 6 divided by partition wall 4 of configuration of a long strip of paper which is perpendicular to a longer direction of transparent electrode layer 3 can be formed.

EFFECT OF THE INVENTION

According to the manufacturing method of organic electroluminescent device and the organic electroluminescent device of the present invention, functional material consists of low molecular material. Therefore, functional material can coat unevenness in the surface of object. Therefore, improvement of yield can be planned. Even more particularly, withstanding voltage improves. Therefore, luminance in luminescence can be improved. Even more particularly, flattening processing in the surface of the first electrode is needless. Therefore, simplification of manufacturing process and reduction of a manufacture cost can be planned.

According to the invention of claim 1,6, unevenness in the surface of the first electrode layer is coated by application of ink with levelling characteristics. Therefore, the surface becomes flat. Application of a local high electric field to organic luminescence media layer is prevented. That organic luminescence media layer is subjected to great load is inhibited. Therefore, life time of organic luminescence media layer gets longer. Functional material is constructed by means of low molecular material. Therefore, even if concentration of functional material in ink rises by drying of ink, flowability and leveling characteristic of ink are maintained. Therefore, unevenness in the surface of the object which ink is applied to is coated with ink. Thus, improvement of yield can be planned. In addition, film thickness becomes uniform. Therefore, withstanding voltage improves. Luminance in luminescence increases. In addition, flattening processing such as polish is needless for surface of the first electrode. Therefore, simplification of manufacturing process and reduction of a manufacture cost can be planned. Even more particularly, the refinement of low molecular material is easier than the refinement of polymeric material. Therefore, in the case of low molecular material, contaminant causing degradation of life time and quality is hard to be included. Therefore, material costs can be reduced.

According to the invention of claim 2,7, the functional layer comprising low molecular material can coat side surface of the unevenness in the case of big unevenness such as step between a fringe of the first electrode layer and the substrates. Therefore, the pixel that aperture area is large can be formed. In other words, a short circuit between the second electrode layer on a top face of organic luminescence media layer and the first electrode layer is prevented. Therefore, when the organic luminescence media layer is formed on the first electrode layer, the organic luminescence media layer may be formed in a penumbra of the first electrode layer at the same time. Therefore, the formation of the pixel that aperture area is large can be planned.

According to the invention of claim 3, the functional layer comprising low molecular material can be printed on surface of object by relief printing on surface of object.

According to the invention of claim 4, the functional layer comprising low molecular material is printed by inversion offset printing. Ink includes low molecular material.

By means of a reason same as statement above, ink can maintain viscosity. An ink layer applied to blanket surface is easy to be cut. Therefore, pattern of predetermined configuration can be formed.

According to the invention of claim 5, the functional layer is printed by fixing ink by so-called ink jet process. Ink includes low molecular material. Even if density of low molecular material rises, viscosity of ink can be maintained. An outlet jetting minute droplet of ink can be prevented from being clogged up.

Example 1

Organic electroluminescent device 1 of the present invention is explained by an example next.

At first, as example 1, organic luminous layer 8 was formed by relief printing. Organic electroluminescent device was produced.

Translucency substrate 2 is explained below. It was glass of 100 mm square, and its thickness was 0.7 mm.

Transparent electrode layer 3 of configuration of a long strip of paper was formed. Width of transparent electrode layer 3 was 80 μm, and the thickness was 0.15 μm. Pitch of transparent electrode layer 3 was 120 μm.

The surface roughness Ra of transparent electrode layer 3 was 20 nm in every domain of 200 μm$^2$.

In addition, the profile of partition wall 4 was trapezoid. The length of a side of a bottom part of trapezoid was 30 μm. The length of a side of the top of trapezoid was 15 μm. The height of trapezoid was 1 μm.

A formation method of partition wall 4 is described below. By using a photosensitive resin, developing by photolithography technics was performed. Partition wall 4 was formed by baking at about 200 degrees Celsius for 60 minutes.

A manufacture method of hole transport layer 7 is explained below. PEDOT was used as hole transport material. PEDOT was scattered in water. The density of this fluid dispersion was 1% by weight. This fluid dispersion was applied by spin coat method. Hole transport layer 7 was formed by drying this fluid dispersion.

Low molecular organic luminescent material used for a red luminescence pixel is described below. DCJTB which is dope materials was added in Alq3 so that doping density was 2%.

In addition, Alq3 was used as low molecular organic luminescent material used for a green emission pixel.

In addition, low molecular organic luminescent material used for a blue luminescence pixel is described below. Zn (BOX) 2 that is dope material was added in Alq3 so that doping density was 2%.

And these low molecular organic luminescent materials were dissolved in liquid mixture of toluene of 90% by weight and CHB of 10% by weight respectively, and three kinds of solution was made.

These solutions were used as organic luminescence ink.

The density of low molecular organic luminescent material of each color was 2% by weight.

And, every printing of each color, they were dried under inert atmosphere at 150 degrees Celsius for 30 minutes.

Organic luminous layer 8 that thickness was 70 nm was obtained.

Voltage was applied to transparent electrode layer 3 and counter electrode layer 6 of organic electroluminescent device produced in this way. The display test result that luminance was 10000 cd/cm$^2$ in 10V applied voltage was provided. The luminescence failure pixel was not recognized.

Example 2

Organic electroluminescent device was produced by means of forming organic luminous layer 8 by inversion offset printing next. About organic luminous layers 8, every printing of each color, they were dried under inert atmosphere at 160 degrees Celsius for 30 minutes. The thickness was 70 nm.

Voltage was applied to transparent electrode layer 3 and counter electrode layer 6 of organic electroluminescent device 1 produced in this way. The display test result that luminance was 8500 cd/cm$^2$ in 10V applied voltage was provided. The luminescence failure pixel was not recognized.

Example 3

Organic electroluminescent device was produced by means of forming organic luminous layer 8 by ink jet process next. In addition, illustration of a point same as example 1 is omitted in the embodiment.

About organic luminous layers 8, every printing of each color, they were dried under inert atmosphere at 150 degrees Celsius for 30 minutes. The thickness was 70 nm.

Voltage was applied to transparent electrode layer 3 and counter electrode layer 6 of organic electroluminescent device 1 produced in this way. The display test result that luminance was 8700 cd/cm$^2$ in 10V applied voltage was provided. The luminescence failure pixel was not recognized.

In addition, the present invention is not limited by the above described embodiment. As for the present invention, various kinds of modification is possible in the range which does not deviate from general meaning of the present invention. By way of example only, in the above described embodiment, even active matrix configuration is preferable.

Active matrix configuration is explained below.

Thin film transistor and electric wiring such as signal lines connected to the thin-film transistor are formed on translucency substrate 2. Transparent electrode layer 3 is formed on this thin film transistor or translucency substrate 2. Thus, in the surface of transparent electrode layer 3, the unevenness which depends on the configuration of thin film transistor and the like is formed.

Organic luminous layer 8 contains low molecular organic luminescent material. Therefore, ink for organic luminous layer 8 coats this unevenness in printing of organic luminous layer 8. In addition, this ink can flatten the surface.

In addition, electron transport layer may be laminated on a top face of organic luminous layer 8. For example, as the electron transport layer, the material which dissolved N, N'-di (1-naphthyl)-N, N'-diphenyl-1,1'-biphenyl-4,4'-diamine in polymeric materials such as polystyrene, polymethylene methacrylate and polyvinylcarbazole can be used.

In addition, a hole blocking layer, a hole injection layer, an electron injection layer and an electron blocking layer may be formed.

A hole injection layer and an electron blocking layer have the following function same as hole transport layer 7. While a hole injection layer and an electronic blocking layer can advance hole from anode to cathode, a hole injection layer and an electron blocking layer prevent an electron from going to anode. An anode is transparent electrode layer 3, and a cathode is counter electrode layer 6.

While a hole blocking layer, an electron transport layer and an electron injection layer can advance an electron from cathode to anode, a hole blocking layer, an electron transport layer and an electron injection layer prevent a hole from going to cathode.

Among organic luminescence media layer 5, only organic luminous layer 8 is formed by printing solution of functional low molecular material.

However, hole transport layer 7 may be formed by printing solution of functional low molecular material. Both organic luminous layer 8 and hole transport layer 7 may be formed by printing solution of functional low molecular material.

Even more particularly, electronic transport layer, hole blocking layer, electron injection layer and electron blocking layer may be formed by printing solution of functional low molecular material.

In addition, at least one layer among organic luminescence media layer 5 except organic luminous layer 8 may be formed by functional low molecular material.

In addition, thin film of lithium fluoride and the like may be provided with between counter electrode layer 6 and organic luminescence media layer 5.

Evaporation masks of metal membrane or ceramic membrane can be used to form counter electrode layer 6 of configuration of a long strip of paper.

Even more particularly, a protective layer made of mineral of insulating properties or resin may be provided on counter electrode layer 6.

Partition wall 4 may be formed between a penumbra of transparent electrode layer 3 and a penumbra of other neighboring transparent electrode layers 3. Even configuration without partition wall 4 is preferable.

What is claimed is:

1. A manufacturing method of an organic electroluminescent device, the method comprising:
    forming a first electrode on a substrate;
    forming an organic luminescence media layer over the first electrode which emits light by applying a voltage wherein the organic luminescence media layer includes at least a hole transport layer and an organic luminous layer; and
    forming a second electrode on the organic luminescence media layer,
    wherein the method further comprising:
    forming the hole transport layer by applying a polymeric hole transport material; and further forming the organic luminous layer on the hole transport layer by applying an ink including 0.3% by weight-3% by weight of a low molecular organic luminous material having a molecular weight less than or equal to 5000 Daltons,
    wherein the polymeric hole transport material is poly aniline derivative, poly thiophenes, polyvinyl carbazoles, poly(3,4-ethylenedioxy thiophene) or mixture with poly(3,4-ethylenedioxy thiophene) and polystyrene sulfonate, wherein a surface of the first electrode which is not coated by the hole transport layer is coated by the organic luminous layer.

2. The manufacturing method of an organic electroluminescent device according to claim 1, wherein the organic luminous layer includes organic luminous layers having red, green and blue luminescent colors, and wherein at every time the organic luminous layers having red, green and blue luminescent colors are respectively printed, the organic luminescent layers are respectively dried.

3. A manufacturing method of an organic electroluminescent device,
    the method comprising:
    forming a first electrode on a substrate;
    forming an organic luminescence media layer over the first electrode which emits light by applying a voltage wherein the organic luminescence media layer includes at least a hole transport layer and an organic luminous layer; and
    forming a second electrode on the organic luminescence media layer,
    wherein the method further comprising;
    forming the hole transport layer by applying a polymeric hole transport material; and further forming the organic luminous layer which includes organic luminous layers having red, blue and green luminescent colors on the hole transport layer by applying inks including 0.3% by weight-3% by weight of low molecular organic luminous materials having a molecular weight less than or equal to 5000 Daltons and drying the organic luminous layers having the luminescent colors respectively at every time of printing the organic luminous layers,
    wherein a surface of the first electrode which is not coated by the hole transport layer is coated by the organic luminous layer.

4. The manufacturing method of an organic electroluminescent device according to claim 3,
    wherein the polymeric hole transport material is poly aniline derivative, poly thiophenes, polyvinyl carbazoles, poly(3,4-ethylenedioxy thiophene) or mixture with poly(3,4-ethylenedioxy thiophene) and polystyrene sulfonate.

5. The manufacturing method of an organic electroluminescent device according to claim 3,
    wherein the organic luminous layers are heated and dried under an inert atmosphere.

6. A manufacturing method of an organic electroluminescent device,
    the method comprising;
    forming a first electrode on a substrate;
    forming an organic luminescence media layer over the first electrode which emits light by applying a voltage wherein the organic luminescence media layer includes at least a hole transport layer and an organic luminous layer; and
    forming a second electrode on the organic luminescence media layer,
    wherein the method further comprising:
    forming the hole transport layer by applying a polymeric hole transport material; and further forming the organic luminous layer on the hole transport layer and on a surface of the first electrode which is not coated by the hole transport layer by applying an ink including 0.3% by weight-3% by weight of a low molecular organic luminous material having a molecular weight less than or equal to 5000 Daltons.

7. The manufacturing method of an organic electroluminescent device according to claim 6,
    wherein the polymeric hole transport material is poly aniline derivative, poly thiophenes, polyvinyl carbazoles, poly(3,4-ethylenedioxy thiophene) or mixture with poly(3,4-ethylenedioxy thiophene) and polystyrene sulfonate.

8. The manufacturing method of an organic electroluminescent device according to claim 6, wherein the organic luminous layer includes organic luminous layers having red, green and blue luminescent colors and wherein at every time the organic luminous layers having red, green and blue luminescent colors are respectively printed, the organic luminous layers are respectively dried.

* * * * *